(12) United States Patent
Jacob

(10) Patent No.: US 6,567,961 B2
(45) Date of Patent: May 20, 2003

(54) METHOD FOR DETECTING LACK OF SYNCHRONISM IN VLSI DESIGNS DURING HIGH LEVEL SIMULATION

(75) Inventor: François Jacob, Vence (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,232

(22) Filed: Dec. 4, 2001

(65) Prior Publication Data

US 2002/0073383 A1 Jun. 13, 2002

(30) Foreign Application Priority Data

Dec. 13, 2000 (EP) .............................................. 00480121

(51) Int. Cl.[7] .......................... G06F 16/50; G01R 31/28
(52) U.S. Cl. .............................. 716/6; 703/19; 714/741
(58) Field of Search ................................ 716/1, 2, 4, 6; 703/13, 14, 15, 16, 17, 19; 714/731, 741, 744

(56) References Cited

U.S. PATENT DOCUMENTS 5,650,938 A * 7/1997 Bootehsaz et al. ............ 703/19
5,903,577 A * 5/1999 Teene .......................... 714/724
6,099,579 A * 8/2000 Dowling et al. ............... 716/18
6,353,906 B1 * 3/2002 Smith et al. .................. 714/731

* cited by examiner

Primary Examiner—Leigh M. Garbowski
(74) Attorney, Agent, or Firm—Anthony J. Canale

(57) ABSTRACT

A method for detecting lack of synchronism during high level simulation of VLSI designs in which asynchronous clock domains (100 and 110) must coexist, which does not require knowledge of hardware target technology delays, and can be carried out by a small computer. The circuit design simulator is adapted to apply a value (A) representative of an unstable state to clock domain interface outputs ($O'_1$) at each pulse of the clocks (clock 1) associated to clock domains used as interface inputs (100), during a predetermined time ($T_A$). Thus, even though unstable states are very short regarding the clock periods and so are very difficult to detect in simulation, the method of the invention allows for detection of all potential synchronism failures. When sampling the value representative of an unstable state, the simulator may forewarn the user, store information and/or launch a standard local static analysis to determine whether or not the detected potential synchronism failure is a circuit design bug.

5 Claims, 5 Drawing Sheets

| Interface 1 | Clock domain A | TA_A |
| --- | --- | --- |
| | Clock domain B | TB_A |
| | Clock domain C | TC_A |
| Interface 2 | Clock domain B | TB_A |
| | Clock domain D | TD_A |

METHOD FOR DETECTING LACK OF SYNCHRONISM IN VLSI DESIGNS DURING HIGH LEVEL SIMULATION

BACKGROUND OF THE INVENTION

1. Field of the Invention

The present invention relates to the field of integrated circuit design and more particularly to simulation of complex logic circuits in which asynchronous time domains must coexist.

2. Background of the Invention

The relentless quest for performance has driven the clock frequency used in commercially available parts such as microprocessors to values expressed in hundreds of megahertz. Also, the dramatic increase of the level of integration that has been achieved in recent years, allowing millions of transistors on a single semiconductor chip, has enabled the possibility of actually merging functions requiring their own independent clocks that are not necessarily run in synchronism. Such a situation is typically encountered in the field of telecommunications when complex circuitry must interface at a very high-speed line e.g., an OC-192 telecommunication line close to 10 gigabit per second with a port of a switching function aimed at dispatching traffic at a network node. Because the speed of the line is set by international standards and the switch has its own set of requirements (such as interfacing simultaneously, through its many ports, different types of lines having to comply with various standards), the very densely integrated circuits designed today have to generally accommodate more than a single clock resulting in the presence of functional islands running asynchronously on the same piece of logic, a complete departure from the simple single-clocked way of implementing logic functions. Furthermore, the increasing complexity of electronic circuits has lead to development of independent building blocks, generally known as IP blocks, adapted to handle specific functions, that may be combined on a single circuit to perform high level functions. To be reusable, these IP blocks are described and tested independently of the hardware target technology, using high level language such as VHDL. Since these IP blocks are independent and may have been developed by different companies, they include their own clocks.

Most of the digital circuits that are commonly referred to as VLSI (Very Large Scale Integration) and are implemented into chips that may include millions of transistors, have, in practice, to house islands of logic operated from different time domains (i.e. clocked from asynchronous timing sources).

Since these logic islands need to interact and interface with each other in order to yield the global function for which the digital circuit is constructed, there is an increased risk to sample and propagate wrong data values from a first clock domain to a second clock domain.

FIG. 1 illustrates a part of a circuit design having two clock domains 100 and 110. The interface between these clock domains is handled by interface 120 having combinatory logic. The inputs $I_1$ and $I_2$ of this interface 120 correspond to the output of the latches 130 and 140 controlled by clock 1 of clock domain 100 and its output $O_1$ is sampled by latch 150 controlled by clock 2 of clock domain 110. An example of this circuit design timing is shown on FIG. 2 where clock 1, clock 2 and interface output $O_1$ behaviors are illustrated. Due to the delays introduced by interface 120, data sampled in latches 130 and 140 is not immediately available at the output of interface 120 after each clock 1 pulse. Thus, after clock 1 pulse n+1, the data sampled in latches 130 and 140 at time n is still available at the output of interface 120 before the data sampled in latches 130 and 140 at time n+1 becomes available, as depicted. Furthermore, there exists a particular state, noted X on the drawings, where the signal value is unstable. This unstable state is related to the time difference between paths contained in interface 120. Even if a single unstable state is represented per clock period on the drawing, several ones could exist. Sampling during an unstable state is avoided since it is meaningless. Thus, it is desirable to detect such unstable states in simulation to correct potential circuit design bugs. In this example, the first and third sampling at time m and m+2 respectively will not detect any lack of synchronism while the second sampling at time m+1 will detect an unstable state. As depicted, unstable state located in time period [n,n+1] has not been detected even though it represents a potential synchronism failure since sampling has been done close to and before it. It is to be noticed that unstable states are very short regarding a clock period and thus, the probability to sample a signal in an unstable period is very low in simulation. Therefore, the detection of unstable states requires very long simulations carried out by computer having important resources.

The most common approach to handle this problem is to simulate the circuit design, or a part of a circuit design, using its low level form, i.e. the circuit design mapped on the hardware target technology, taking into account the delays generated by the technology, and to perform an event driven simulation. However, this method requires a synthesis of the circuit design and a static timing analysis on placed/wired circuit design to get the proper circuit delays. Thus, the synchronism checking can only be done at the end of the circuit design cycle.

BRIEF SUMMARY OF THE INVENTION

It is a broad object of the invention to remedy the shortcomings of the prior art as described herein above.

It is another object of the invention to disclose a method for detecting lack of synchronism in VLSI designs during high level simulation.

It is still another object of the invention to provide a method for detecting lack of synchronism in VLSI designs during high level simulation, adapted to be carried out by a small computer.

It is a further object of the invention to prevent the generation and propagation of wrongly sampled signals.

The accomplishment of these and other related objects is achieved by a method in a circuit design simulator for detecting lack of synchronism between at least two clock domains, each comprising a clock signal, wherein at least one clock domain of said at least two clock domains transmits data to at least one other clock domain of said two clock domains, comprising the step of applying a value representative of an unstable state to the input of said one other clock domain at each pulse of the clock of said at least one clock domain during a predetermined time, wherein lack of synchronism is detected when said at least one other clock domain samples said value representative of an unstable state.

The novel features believed to be characteristic of this invention are set forth in the appended claims. The invention itself, however, as well as these and other related objects and advantages thereof, will be best understood by reference to the following detailed description to be read in conjunction with the accompanying drawings.

DETAILED DESCRIPTION OF THE INVENTION

The method of the invention force the circuit design simulator to detect all of the potential synchronism failures by assigning particular states to the clock domain interface outputs. A value representative of an unstable state is applied to the interface outputs at each pulse of the clocks associated to clock domains used as interface inputs, during a predetermined time. While the values sampled on the standard interface output are certain concerning the detected synchronism failures, the values sampled on the interface output according to the invention are certain concerning their validity. Such a solution drastically reduces the risk of missing clock domain synchronism failures when carrying out high level simulation.

Figure 1:
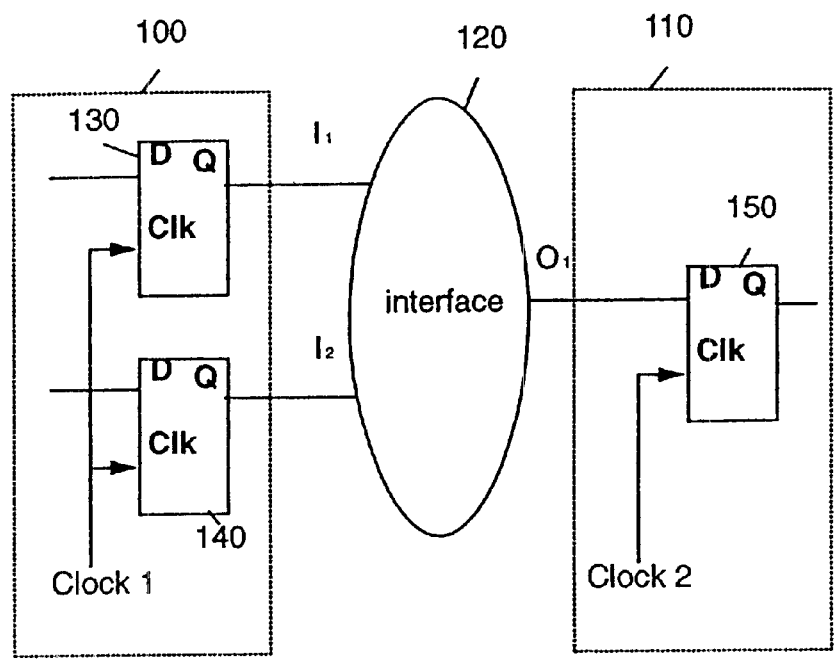
FIG. 1 shows a first standard circuit design part having two clock domains.
Figure 2:
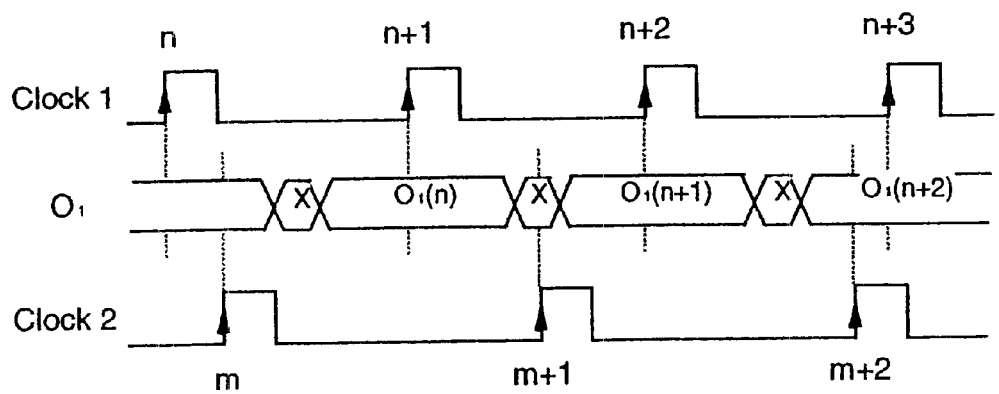
FIG. 2 illustrates an example of the FIG. 1 circuit design behavior.
Figure 3:
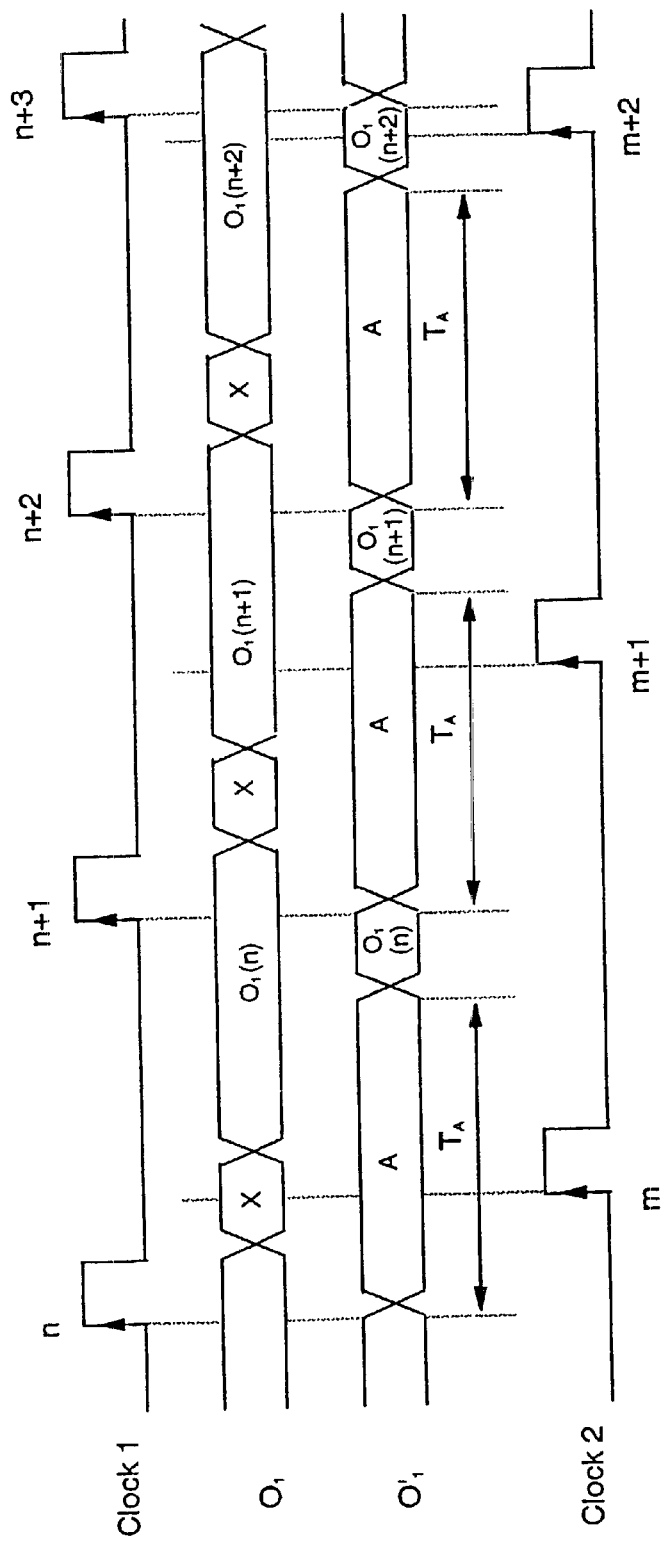
FIG. 3 illustrates an example of the FIG. 1 circuit design behavior when using the method of the present invention.

FIG. 3 illustrates an example of FIG. 1 circuit design behavior using the method of the invention wherein $O_1$ is the standard interface 120 output and $O'_1$ is the interface 120 output using the method of the invention. As described above, unstable states X are very short regarding the clock period and thus are very difficult to detect. In this timing example, sampling of standard output $O_1$ will detect lack of synchronism at time m but not the potential synchronism failure at time m+1. According to the present invention which overcomes this main drawback, a value A representative of an unstable state is applied to the interface output at each clock 1 pulse for a time $T_A$ as depicted on signal $O'_1$. Such a method allows detection of all potential synchronism failures, e.g. at time m and m+1. Obviously, $T_A$ must be less than clock 1 period and greater than interface 120 delays. However, since the aim of the inventive method is to carry out high level simulations, independently of the hardware target technology, the delays can not be evaluated nor estimated. Thus, practically, $T_A$ is set to about 90% to 95% of the period of clock 1. However, depending upon the complexity of the function to be implemented or the hardware target technology, the user may adjust this value, e.g. $T_A$ may be set to 50% of the period of clock 1.

Figures 4, 6:
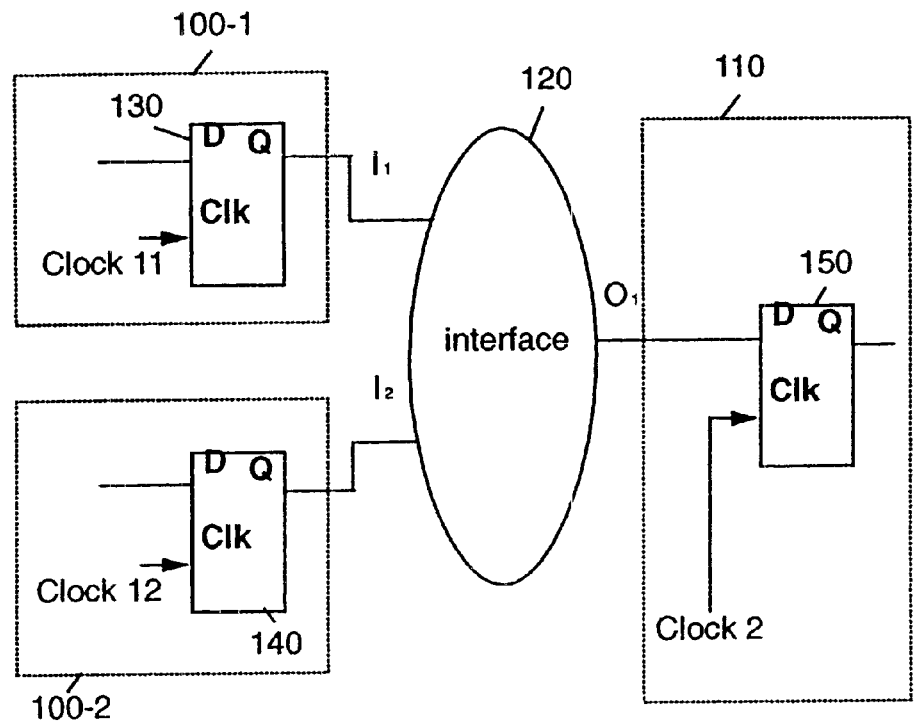
FIG. 4 depicts a second standard circuit design part having three clock domains.
FIG. 6 shows a table indicating the clock domains linked to interface inputs and the time during which the output of a corresponding interface has to be set to a value representative of an unstable state.

FIG. 4 illustrates another circuit design part interfacing three different clock domains. Clock domains 100-1 and 100-2 have latches 130 and 140 controlled by clocks 11 and 12, respectively. In compliance with the above mentioned example by reference to FIG. 1, the outputs of latches 130 and 140 represent the inputs of interface 120. Likewise, the input of clock domain 10 having latch 150 controlled by clock 2 is linked to interface output $O_1$.

Figure 5:
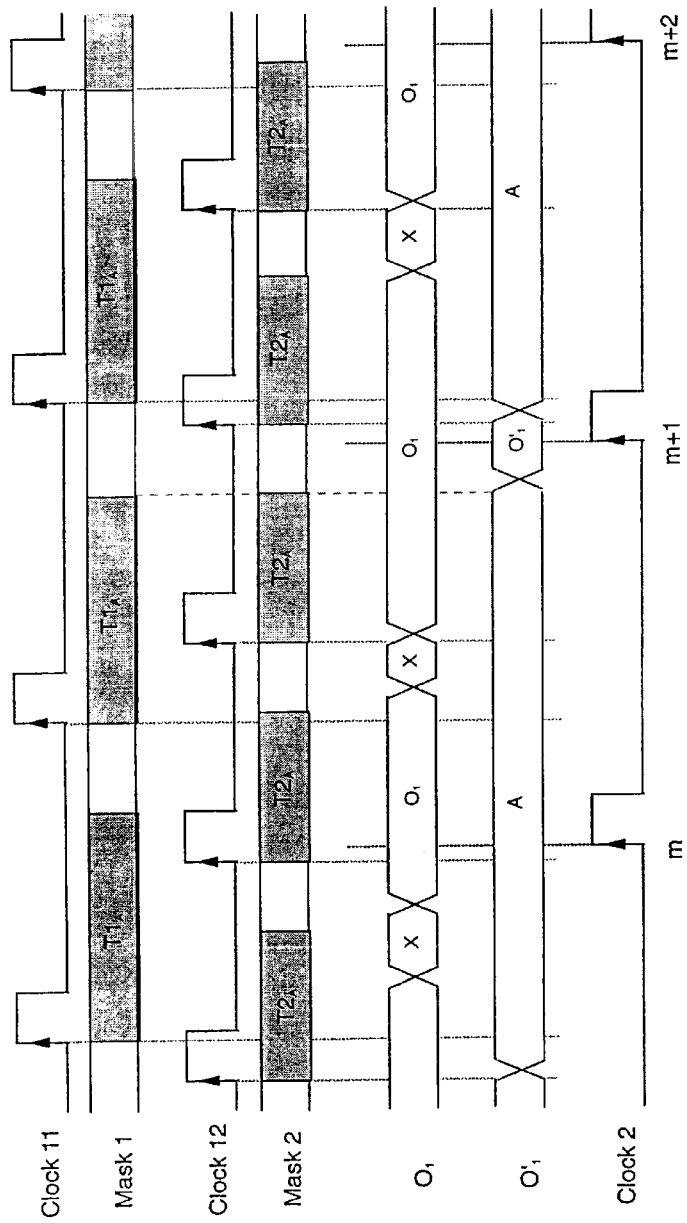
FIG. 5 illustrates an example of the FIG. 4 circuit design behavior when using the method of the present invention.

FIG. 5 shows a timing example of the circuit design part shown in FIG. 4 where the behaviors of clock 11, clock 12, clock 2, standard interface output $O_1$ and interface output $O'_1$ are illustrated. According to the method of the present invention, the value A representative of an unstable state is applied to the output of the interface $O'_1$ at each pulse of the clocks associated to clock domains used as interface inputs, during a predetermined time. The predetermined time during which the output of the interface is set to the value A could be common for all the clock domain clocks or a predetermined time could be associated to each of them. In the described example, predetermined times $T1_A$ and $T2_A$ are associated to clock domain clocks 11 and 12, respectively. For sake of clarity, masks are shown in FIG. 5: mask 1 and mask 2 are associated to clock 11 and 12, respectively. The unshaded parts of these masks correspond to the time periods during which a signal can be safely sampled and the shaded parts correspond to the time periods during which synchronism failures may occur. The mask is shaded at each clock pulse during time $T_A$, e.g. at clock 11 pulse during time $T1_A$. When simulated, the value A is applied to interface 120 output at clock 11 and clock 12 pulses during time $T1_A$ and $T2_A$ respectively, i.e. when mask 1 or mask 2 are shaded, as shown on signal $O_1$ timing of FIG. 5. Thus, still referring to FIG. 5, sampling signal $O'_1$ at time m will detect a potential synchronism failure that is not detected using standard interface output $O_1$. The values sampled at time m+1 on both signals $O_1$ and $O'_1$ are correct.

After a potential synchronism failure has been detected, the user may analyze it to determine whether it is a circuit design bug or not.

Thus, considering a circuit design having several clock domain interfaces, one embodiment of the method of the present invention is that before simulation, determining all the clock domain outputs used as input of all the clock domain interfaces and storing the result in a table with the associated time $T_A$, as depicted on FIG. 6; and, during simulation, for each clock domain referenced in the above mentioned table, determining the clock domain interface(s) using the clock domain output as input and forcing the respective output(s) to the value A at each clock pulse during the time $T_A$ indicated in the above mentioned table.

Figure 7:
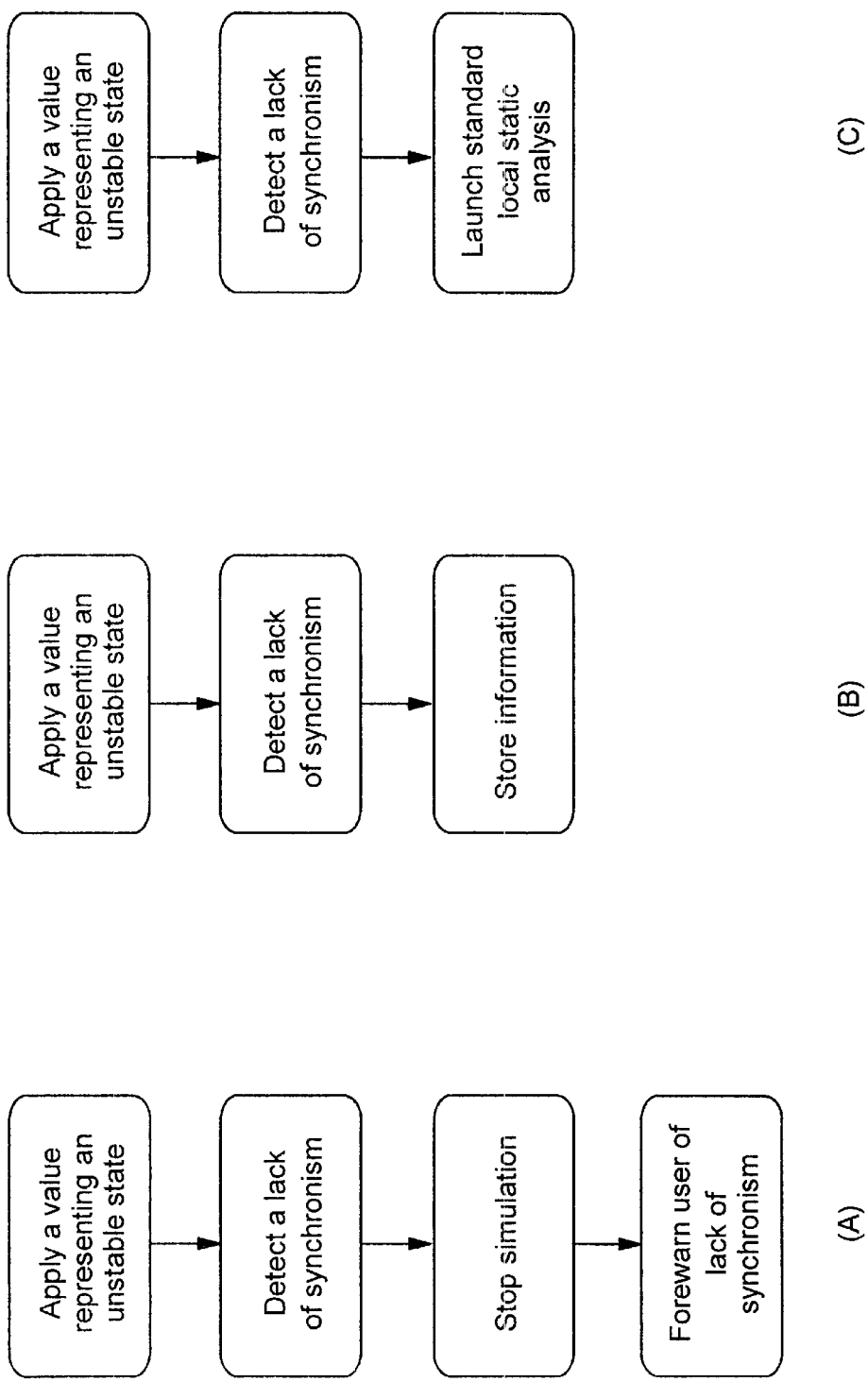
FIG. 7 illustrates additional embodiments of the method of the present invention.

During simulation and depending upon the user's choice, the circuit design simulator could stop and forewarn the user as soon as a potential synchronism failure is detected as shown in FIG. 7(A) or store all the potential synchronism failures in a file with the associated conditions, i.e. the values of the concerned clocks, signals and simulation parameters, as shown in FIG. 7(B) without stopping the simulation so that the user could analyze all the failures after the simulation. FIG. 7(C) illustrates another embodiment where the detection of a potential synchronism failure may launch a standard local static analysis to automatically determine whether or not it is a circuit design bug. For example, such local static analysis may consist of determining the logic cone of the clock domain interface where the potential synchronism failure took place and analyzing its timing.

While the invention has been described in terms of a preferred embodiment, those skilled in the art will recognize that the invention can be practice with other kinds of circuit designs and for other tasks. In particular, latches may be replaced by other memory devices and the clock domain interface may link more than three clock domains.

What is claimed is:

1. In a circuit design simulator, a method for detecting lack of synchronism between a first clock domain and a second clock domain, the first and second clock domains comprising a first and a second clock signal respectively, wherein the first clock domain transmits data to the second clock domain, the method comprising the steps of:

applying a value representing an unstable state for a predetermined time to the input of the second clock domain at each pulse of the first clock signal; and, detecting a lack of synchronism when the second clock domain samples the represented value.

2. The method of claim 1, wherein the predetermined time is about 90% of the time period of the first clock signal.

3. The method of claim 1 further comprising the step of:

storing information representing the lack of synchronism when the second clock domain samples the represented value.

4. The method of claim 1 further comprising the step of:

stopping the circuit design simulator when the second clock domain samples the represented value.

5. The method of claim 1 further comprising the step of:

launching a standard local static analysis when the second clock domain samples the represented value.

* * * * *